(12) United States Patent
Han et al.

(10) Patent No.: US 10,840,272 B2
(45) Date of Patent: Nov. 17, 2020

(54) DISPLAY DEVICE

(71) Applicant: Samsung Display Co. Ltd., Yongin (KR)

(72) Inventors: Se Hee Han, Seoul (KR); Tae Gyun Kim, Seoul (KR)

(73) Assignee: SAMSUNG DISPLAY CO. LTD., Yongin (KR)

( * ) Notice: Subject to any disclaimer, the term of this patent is extended or adjusted under 35 U.S.C. 154(b) by 0 days.

(21) Appl. No.: 16/704,228

(22) Filed: Dec. 5, 2019

(65) Prior Publication Data

US 2020/0111813 A1 Apr. 9, 2020

Related U.S. Application Data

(63) Continuation of application No. 16/184,075, filed on Nov. 8, 2018, now Pat. No. 10,529,747, which is a continuation of application No. 15/826,219, filed on Nov. 29, 2017, now Pat. No. 10,134,774, which is a continuation of application No. 15/177,364, filed on Jun. 9, 2016, now Pat. No. 9,837,445.

(30) Foreign Application Priority Data

Oct. 16, 2015 (KR) ........................ 10-2015-0144555

(51) Int. Cl.
| | | |
|---|---|---|
| *H01L 27/12* | (2006.01) | |
| *G02F 1/1335* | (2006.01) | |
| *G02F 1/1337* | (2006.01) | |
| *G02F 1/1339* | (2006.01) | |
| *G02F 1/1333* | (2006.01) | |

(52) U.S. Cl.
CPC .......... *H01L 27/124* (2013.01); *G02F 1/1337* (2013.01); *G02F 1/1339* (2013.01); *G02F 1/13394* (2013.01); *G02F 1/133514* (2013.01); *G02F 1/133516* (2013.01); *H01L 27/1259* (2013.01); *H05K 999/99* (2013.01); *G02F 2001/133388* (2013.01)

(58) Field of Classification Search
CPC .......... H05K 1/181; H05K 5/03; H05K 7/203; H05K 1/111; H05K 5/0017
USPC ........................................................ 257/72
See application file for complete search history.

(56) References Cited

U.S. PATENT DOCUMENTS

| | | | |
|---|---|---|---|
| 9,341,759 B2 | 5/2016 | Kim et al. | |
| 2014/0097430 A1 | 4/2014 | Park et al. | |
| 2014/0284591 A1* | 9/2014 | Ono ................... | H01L 27/3246 257/40 |

(Continued)

FOREIGN PATENT DOCUMENTS

KR 10-2012-0047365 5/2012

*Primary Examiner* — Andy Huynh
(74) *Attorney, Agent, or Firm* — Kile Park Reed & Houtteman PLLC

(57) ABSTRACT

A display device includes a first substrate including a display region and a non-display region, the non-display region being positioned on an outside of the display region, a first dam in the non-display region of the substrate, the first dam including a first barrier and a first stopper, the first stopper being on the first barrier and having a concave groove formed thereon, and a first alignment layer covering the display region of the first substrate, at least a part of the first alignment layer extending to the non-display region and contacting a surface of the first stopper.

16 Claims, 14 Drawing Sheets

(56) References Cited

U.S. PATENT DOCUMENTS

| | | |
|---|---|---|
| 2015/0050758 A1 | 2/2015 | Ko et al. |
| 2015/0226990 A1 | 8/2015 | Miyazaki et al. |
| 2016/0204373 A1* | 7/2016 | Park .................... H01L 27/3244 |
| | | 257/40 |
| 2016/0285028 A1 | 9/2016 | Iguchi et al. |
| 2016/0293884 A1 | 10/2016 | Zhang et al. |
| 2017/0059904 A1 | 3/2017 | Kim et al. |

* cited by examiner

DISPLAY DEVICE

CROSS-REFERENCE TO RELATED APPLICATIONS

This is a continuation application based on pending U.S. patent application Ser. No. 16/184,075, filed Nov. 8, 2018, the disclosure of which is incorporated herein by reference in its entirety. U.S. patent application Ser. No. 16/184,075 is a continuation application of U.S. patent application Ser. No. 15/826,219, filed Nov. 29, 2017, now U.S. Pat. No. 10,134,774, issued Nov. 20, 2018, the disclosure of which is incorporated herein by reference in its entirety. U.S. patent application Ser. No. 15/826,219 is a continuation application of U.S. patent application Ser. No. 15/177,364, filed Jun. 9, 2016, now U.S. Pat. No. 9,837,445, issued Dec. 5, 2017, the disclosure of which is incorporated herein by reference in its entirety. U.S. Pat. No. 9,837,445 claims priority benefit of Korean Patent Application No. 10-2015-0144555, filed on Oct. 16, 2015, in the Korean Intellectual Property Office, entitled, "Display Device and Method for Fabricating the Same," the disclosure of which is incorporated herein by reference in its entirety for all purposes.

BACKGROUND

1. Field

Embodiments relate to a display device and a method for fabricating the same.

2. Description of the Related Art

A liquid crystal display, which is a type of display device that has been widely used, can adjust the quantity of penetrating light by applying a voltage to electrodes (a pixel electrode and a common electrode) formed on two opposite substrates and controlling an arrangement of liquid crystal molecules of a liquid crystal layer interposed between the two substrates.

SUMMARY

Embodiments are directed to a display device including a first substrate including a display region and a non-display region, the non-display region being positioned on an outside of the display region, a first dam in the non-display region of the substrate, the first dam including a first barrier and a first stopper, the first stopper being on the first barrier and having a concave groove formed thereon, and a first alignment layer covering the display region of the first substrate, at least a part of the first alignment layer extending to the non-display region and contacting a surface of the first stopper.

Each of the first barrier and the first stopper may extend to form a closed curve surrounding the display region of the first substrate.

The first barrier may form a continuous straight line along each extension direction surrounding the display region of the first substrate. The first stopper may form an uneven line along each extension direction surrounding the display region of the first substrate.

The first stopper may have a width that is smaller than a width of the first barrier in a direction that is perpendicular to an extension direction.

The first stopper may be on at least a part of a side surface of the first barrier and an upper surface of the first barrier.

The first stopper may have a continuous shape or a separated shape on at least the part of the side surface of the first barrier and the upper surface of the first barrier.

A minimum thickness of the first stopper may be equal to or greater than a thickness of a portion of the first alignment layer that is in the display region of the first substrate, and a portion of the first alignment layer that contacts a surface of the first stopper may have a thickness that is greater than a thickness of a portion of the first alignment layer that is in the display region of the first substrate.

A color filter may be in the display region of the first substrate. The first barrier may include the same material as the color filter.

The display device may further include a second substrate opposite to the first substrate in a state where the first alignment layer is interposed between the second substrate and the first substrate, the second substrate including a display region and a non-display region corresponding to the display region and the non-display region of the first substrate, a second dam including a second barrier and a second stopper on the second barrier and having a concave groove formed on a surface thereof, the second dam being in the non-display region of the second substrate, and a second alignment layer covering the display region of the second substrate, at least a part of the second alignment layer extending to the non-display region and contacting a surface of the second stopper.

Each of the second barrier and the second stopper may extend to form a closed curve that surrounds the display region of the second substrate.

The second barrier may form a continuous straight line along an extension direction. The second stopper may form an uneven line along the extension direction.

A minimum thickness of the second stopper may be equal to or greater than a thickness of a portion of the second alignment layer that is in the display region of the second substrate. A portion of the second alignment layer contacts a surface of the second stopper has a thickness that is greater than a thickness of a portion of the second alignment layer that is in the display region of the second substrate.

A column spacer may be arranged in the display region of the second substrate. The second barrier may include the same material as the column spacer.

Each of the first stopper and the first alignment layer may include an alignment material. The alignment material of the first stopper may be different from the alignment material of the first alignment layer.

Embodiments are also directed to a method for fabricating a display device including preparing a first substrate including a display region and a non-display region located on an outside of the display region, forming a first dam in the non-display region of the first substrate such that first dam includes a first barrier and a first stopper on the first barrier, the first stopper having a concave groove formed thereon, and forming a first alignment layer covering the display region of the first substrate, at least a part of the first alignment layer extending up to the non-display region and contacting a surface of the first stopper.

Forming the first barrier may include forming the first barrier together with forming a color filter in the display region of the first substrate through a patterning process. Forming the first stopper may include applying an alignment solution that includes an alignment material on the first barrier using a dispensing process.

Forming the first alignment layer may include discharging an alignment solution onto the display region of the first substrate using a printing process. The alignment solution that forms the first alignment layer may include an alignment material that is different from the alignment material that forms the first stopper.

The viscosity of the alignment solution of the first stopper may be higher than the viscosity of the alignment solution of the first alignment layer.

The method may further include preparing a second substrate including a display region and a non-display region corresponding to the display region and the non-display region of the first substrate, respectively, forming a second dam arranged in the non-display region of the second substrate, the second dam including a second barrier and a second stopper arranged on the second barrier, the second stopper having a concave groove on a surface thereof, forming a second alignment layer covering the display region of the second substrate, at least a part of the second alignment layer extending up to the non-display region and contacting a surface of the second stopper, and interposing a sealing member between the first substrate and the second substrate.

Forming the second barrier may include forming the second barrier together with forming a column spacer in the display region of the second substrate through a patterning process. Forming the second stopper may include applying an alignment solution that includes an alignment material on the second barrier using a dispensing process.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
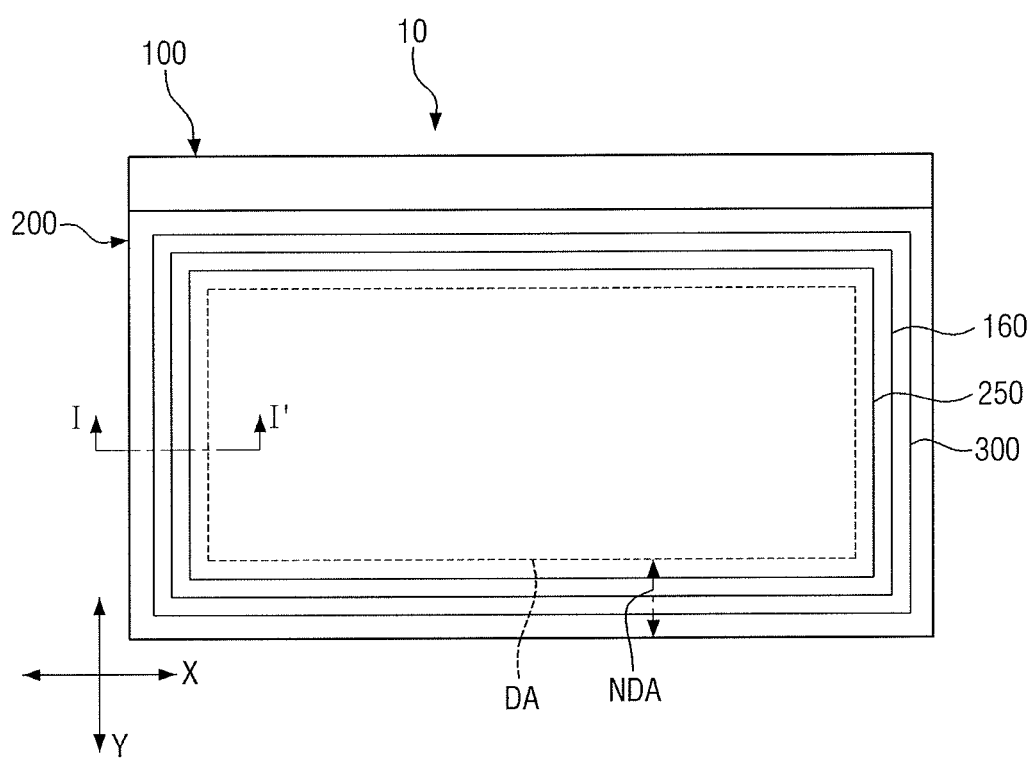
FIG. 1 illustrates a schematic view depicting a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

FIG. 1 illustrates a schematic view depicting a display device according to an embodiment.

Referring to FIG. 1, a display device 10 according to an embodiment may include a first display panel 100, a second display panel 200 opposite to the first display panel 100, and a sealing member 300 bonding the first display panel 100 and the second display panel 200 to each other. A liquid crystal layer LCL (in FIG. 2) may be interposed between the first display panel 100 and the second display panel 200.

The first display panel 100 may include a display region DA that displays an image thereon, the display region DA may including a plurality of pixels that are arranged in the form of a matrix in a first direction X and a second direction Y that crosses the first direction X, and a non-display region NDA that is positioned on an outside of the display region DA to surround the display region DA. In the display region DA of the first display panel 100, a plurality of first electrodes (also called pixel electrodes) PE (in FIG. 2), wirings that drive the first electrodes, and a plurality of thin film transistors TR (in FIG. 1) may be arranged. In the non-display region NDA of the first display panel 100, a drive portion that applies driving signals to the display region DA through the wirings may be arranged.

The second display panel 200 may be oppositely coupled to the first display panel 100. The second display panel 200 may include a display region and a non-display region that respectively correspond to the display region DA and the non-display region NDA of the first display panel 100. Accordingly, hereinafter, the display region and the non-display region of the second display panel 200 are respectively called "DA" and "NDA".

The sealing member 300 may be interposed between the first display panel 100 and the second display panel 200 to surround the display region DA in the non-display regions NDA of the first display panel 100 and the second display panel 200, and to couple a first substrate 110 and a second substrate 210 to each other.

In the non-display regions NDA of the first display panel 100 and the second display panel 200, a first dam 160 and a second dam 250 may be arranged in a region adjacent to the display region DA to surround the display region DA. The first dam 160 and the second dam 250 will be described in detail below.

Hereinafter, the detailed configuration of the display device 10 will be described.

Figure 2:
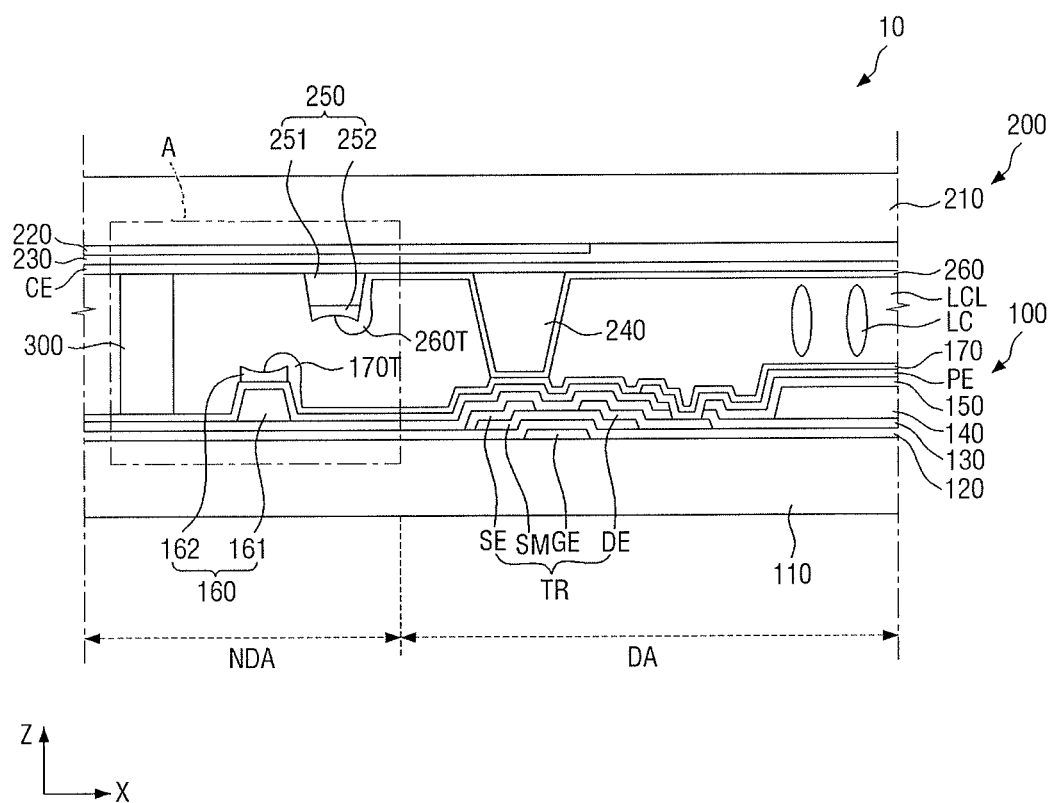
FIG. 2 illustrates a cross-sectional view taken along line I-I' of FIG. 1.

FIG. 2 is a cross-sectional view taken along line I-I' of FIG. 1.

Referring to FIG. 2, the first display panel 100 of the display device 10 may include a first substrate 110, a thin film transistor TR, a first insulating layer 120, a second insulating layer 130, a color filter 140, a third insulating layer 150, a first electrode (or pixel electrode) PE, a first dam 160, and a first alignment layer 170, which are stacked in a third direction Z that is perpendicular to the first direction X.

The first substrate 110 may include the display region DA and the non-display region NDA that are defined on the first display panel 100. The first substrate 110 may include an insulating material, such as transparent glass, quartz, ceramic, silicon, or transparent plastic. The insulating material may be appropriately selected in accordance with a need of a manufacturer. In some embodiments, the first substrate 110 may have flexibility. For example, the first substrate 110 may be a substrate having a shape that is changeable, for example, by rolling, folding, or bending.

The thin film transistor TR may be arranged in the display region DA of the first substrate 110. The thin film transistor TR may include a gate electrode GE connected to a gate line, a semiconductor layer SM, a source electrode SE connected to a data line, and a drain electrode DE.

The gate electrode GE may be arranged in the display region DA of the first substrate 110 The gate electrode GE may be formed to project from the gate line that extends in the first direction X on a plane toward the semiconductor layer SM. The gate electrode GE may include any one of indium tin oxide (ITO), indium zinc oxide (IZO), and indium tin zinc oxide (ITZO). In some implementations, the gate electrode GE may have a two-layer structure that includes a first electrode layer that is made of the above-described material and a second electrode layer that is made of a a metal, such as copper (Cu), molybdenum (Mo), aluminum (Al), tungsten (W), chromium (Cr), or titanium (Ti), or an alloy including at least one of the above-described metals.

The semiconductor layer SM may be arranged on the gate electrode GE in a state where the first insulating layer 120 is interposed between the semiconductor layer SM and the gate electrode GE. The semiconductor layer SM may include an activation layer that is provided on the first insulating layer 120 and an ohmic contact layer that is provided on the activation layer. In some implementations, the semiconductor layer SM may be arranged between the data line extending in the second direction Y (in FIG. 1) and the first insulating layer 120.

The source electrode SE may be arranged on the semiconductor layer SM, and may overlap at least a part of the gate electrode GE on a plane. The source electrode SE may be formed to project from the data line. The drain electrode DE may be arranged on the semiconductor layer SM to be spaced apart from the source electrode SE, and may overlap at least a part of the gate electrode GE on a plane. The source electrode SE and the drain electrode DE may be made of a metal, such as copper, molybdenum, aluminum, tungsten, chromium, or titanium, or an alloy including at least one of the above-described metals. The source electrode SE and the drain electrode DE may overlap a part of the semiconductor layer in a region excluding an apart region between the source electrode SE and the drain electrode DE.

The first insulating layer 120 may be arranged in the display region DA and the non-display region NDA of the first substrate 110, and may be interposed between the gate electrode GE and the semiconductor layer SM to electrically insulating the gate electrode GE and the semiconductor layer SM from each other. The first insulating layer 120 may include an insulating material, for example, silicon nitride or silicon oxide. In some implementations, the data line may be arranged on the first insulating layer 120.

The second insulating layer 130 may be arranged in the display region DA and the non-display region NDA on the first insulating layer 120. The second insulating layer 130 may cover the source electrode SE and the drain electrode DE. The second insulating layer 130 may have a through-hole that exposes the drain electrode DE. The second insulating layer 130 may include an insulating material, for example, silicon nitride or silicon oxide.

The color filter 140 may be arranged corresponding to each pixel of the display region DA on the second insulating layer 130. The color filter 140 may provide a color to light that penetrates the liquid crystal layer LCL. The color filter 140 may include one of a red filter, a green filter, and a blue filter, as examples. The color filter 140 may include an organic material. In some implementations, a first barrier 161 of the first dam 160 may be arranged on the second insulating layer 130 in the non-display region NDA. The first barrier 161 of the first dam 160 will be described in detail below.

The third insulating layer 150 may be arranged in the display region DA and the non-display region NDA on the second insulating layer 130. The third insulating layer 150 may cover the color filter 140 and the first barrier 161 of the first dam 160. In this case, the third insulating layer 150 may be conformably formed along the first barrier 161 of the first dam 160. The third insulating layer 150 may include an insulating material, for example, silicon nitride or silicon oxide. Like the second insulating layer 130, the third insulating layer 150 may include a through-hole f that exposes the drain electrode DE.

The first electrode PE may be arranged corresponding to each pixel of the display region DA on the third insulating layer 150. The first electrode PE may be electrically connected to the drain electrode DE. The first electrode PE may include a transparent conductive material, for example, any one of indium tin oxide (ITO), indium zinc oxide (IZO), and indium tin zinc oxide (ITZO).

The first dam 160 may be arranged on a region of the non-display region NDA that is adjacent to the display region DA on the first substrate 110. The first dam 160 may include the first barrier 161 and a first stopper 162 that are stacked in the third direction Z.

The first barrier 161 may be arranged on the same layer as the color filter 140, for example, between the second insulating layer 130 and the third insulating layer 150. The first barrier 161 may extend to surround the display region DA of the first substrate 110, and may form a closed curve. The first barrier 161 may have a predetermined thickness T1 (in FIG. 3).

The first stopper 162 may be arranged on the third insulating layer 150 to overlap the first barrier 161. Like the first barrier 161, the first stopper 162 may also extend to surround the display region DA of the first substrate 110 and may form a closed curve. The first stopper 162 may have the lyophobic characteristic with respect to an alignment solution that is used when the first alignment layer 170 is formed, and may have a thickness that is smaller than the thickness T1 (in FIG. 3) of the first barrier 161. For example, the maximum thickness T2 (in FIG. 3) of the first stopper 162 may be smaller than the thickness T1 (in FIG. 3) of the first barrier 161.

The first stopper 162 may be formed using a dispensing process. The first stopper 162 may include an alignment material having the lyophobic characteristic with respect to the alignment solution that is used when the first alignment layer 170 is formed. The alignment material of the first stopper 162 may be an organic polymer material. The organic polymer material may include, for example, at least one of a polyimide, a polyamic acid, and a polysiloxane.

When forming the first alignment layer 170 that is arranged on the first electrode PE using a printing method such as an inkjet printing method to apply an alignment solution including an alignment material, the first dam 160 may help to prevent the alignment solution that is discharged onto the first electrode PE from spreading toward the non-display region NDA. For example, the alignment solution discharged onto the first electrode may have a tendency to spread due to spread properties of the alignment solution, and such spreading may be blocked by the first dam 160. For example, the first barrier 161 having the predetermined thickness T1 may serve to primarily prevent the above-described spreading. The first stopper 162 having the lyophobic characteristic with respect to the alignment solution may serve to secondarily prevent the spreading. The details of the first dam 160 will be described below.

The first alignment layer 170 may be arranged to cover the display region DA of the first substrate 110, for example, to cover the first electrode PE and the third insulating layer 150. At least a portion of the first alignment layer 170 may extend up to the non-display region NDA of the first substrate 110 to come into contact with the surface of the first stopper 162 of the first dam 160. In this case, a part 170T of the first alignment layer 170 may overlap a part of a concave groove g1 (in FIG. 3) of the first stopper 162. Such a structure may be obtained in accordance with the limiting of flowing of the alignment solution to the non-display region NDA by the first stopper 162, which has the lyophobic characteristic with respect to the alignment solution that is discharged onto the first electrode PE and in accordance with increasing a resistive force against the flowing of the alignment solution to the non-display region NDA using the groove g1 (in FIG. 3), in the case where the first alignment layer 170 is formed using a printing method, such as an inkjet printing method. In some implementations, in order to obtain good wettability of the alignment solution with respect to the first electrode PE and the third insulating layer 150 when the first alignment layer 170 is formed, the surface of the first substrate 110, on which the third insulating layer 150 is formed, may have been treated such that the whole surface of the first substrate 110 has the lyophilic characteristic.

The first alignment layer 170 as described above may serve to initially align liquid crystal molecules LC of the liquid crystal layer LCL. The first alignment layer 170 may include an alignment material. The alignment material of the first alignment layer 170 may be an organic polymer material. The organic polymer material may include, for example, at least one of a polyimide, a polyamic acid, and a polysiloxane.

The second panel 200 may include a second substrate 210, a light blocking layer 220, an overcoat layer 230, a spacer 240, a second electrode (also called a common electrode) CE, a second dam 250, and a second alignment layer 260.

The second substrate 210 may include a display region DA and a non-display region NDA that are defined on the second display panel 200. The second substrate 210 may be oppositely coupled to the first substrate 110, and may have a size that is smaller than the size of the first substrate 110. Accordingly, the second substrate 210 may cover the display region DA of the first substrate 110 and may expose a part of the non-display region NDA. In the same manner as the first substrate 110, the second substrate 210 may include an insulating material, such as transparent glass, quartz, ceramic, silicon, or transparent plastic, and may be appropriately selected in accordance with a need of a manufacturer. In some embodiments, the second substrate 210 may have flexibility. The second substrate 210 may be a substrate having a shape that is changeable, for example, by rolling, folding, or bending.

The light blocking layer 220 may be arranged on the second substrate 210. For example, the light blocking layer 220 may be arranged on a lower portion of the second substrate 210. The light blocking layer 220 may be arranged in the non-display region NDA and in a non-pixel region in which a thin film transistor TR is arranged, on the second substrate 210. The light blocking layer 220 may overlap a gate line, a data line, and the thin film transistor TR. The light blocking layer 220 may be formed of a light blocking material to intercept undesired light in implementing an image. For example, the light blocking layer 220 may intercept light leakage that could occur at edges of the liquid crystal layer LCL or color mixing that could occur at edges of the color filter 140. Although FIG. 2 illustrates that the light blocking layer 220 does not overlap the edges of the color filter 140, in some implementations, the light blocking layer 220 may overlap the edges of the color filter 140.

The overcoat layer 230 may be arranged on the second substrate 210 to cover the light blocking layer 220. The overcoat layer 230 may serve to protect and planarize the light blocking layer 220. The overcoat layer 230 may be formed using an acrylic epoxy material.

The second electrode CE may be arranged on the overcoat layer 230 over the entire surfaces of the display region DA and the non-display region. The second electrode CE may receive a common voltage from a common line and may generate an electric field together with the first electrode PE to control the alignment direction of the liquid crystal molecules LC included in the liquid crystal layer LCL. The second electrode may include a transparent conductive material. For example, the second electrode CE may include indium tin oxide (ITO) or indium zinc oxide (IZO).

The column spacer 240 may be arranged on the second electrode CE in a portion of the non-pixel region of the display region DA where the first electrode PE is not arranged. The column spacer 240 may maintain a cell gap between the first display panel 100 and the second display panel 200. The column spacer 240 may include an organic material. As illustrated in FIG. 2, the column spacer 240 may be positioned in a region that corresponds to the thin film transistor.

The second dam 250 may be arranged on the second substrate 210 in a region of the non-display region NDA that is adjacent to the display region DA. For example, the second dam 250 may be arranged on the second electrode CE so as to not overlap the first dam 160. In this case, when the first display panel 100 and the second display panel 200 are coupled to each other, interference between the first dam 160 and the second dam 250 may be reduced in a determined cell gap between the first display panel 100 and the second display panel 200. The second dam 250 may include a second barrier 251 and a second stopper 252 that are stacked in the third direction Z.

The second barrier 251 may be arranged on the same layer as the column spacer 240, for example, between the second electrode CE and the liquid crystal layer LCL. The second barrier 251 may extend to surround the display region DA of the second substrate 210 and may form a closed curve. The second barrier 251 may have a predetermined thickness T11 (in FIG. 3).

The second stopper 252 may be arranged on the second electrode CE to overlap the second barrier 251. For example, like the second barrier 251, the second stopper may also extend to surround the display region DA of the second substrate 210 to form a closed curve. The second stopper 252 may have a lyophobic characteristic with respect to an alignment solution that is used when the second alignment layer 260 is formed. The second stopper 252 may have a thickness that is less than the thickness T11 (in FIG. 3) of the second barrier 251. For example, the maximum thickness T12 (in FIG. 3) of the second stopper 252 may be less than the thickness T11 (in FIG. 3) of the second barrier 251.

The second stopper 252 may be formed using a dispensing process. The second stopper 252 may include an alignment material having the lyophobic characteristic with respect to the alignment solution that is used when the second alignment layer 260 is formed. The alignment material of the second stopper 252 may be an organic polymer material. The organic polymer material may include, for example, at least one of a polyimide, a polyamic acid, and a polysiloxane.

When the second alignment layer 260 is formed on the second electrode CE using a printing method, such as an inkjet printing method, to apply an alignment solution including an alignment material, the second dam 250 may help to prevent the alignment solution that is discharged onto the second electrode CE from spreading toward the non-display region NDA due to spread properties of the alignment solution. For example, the second barrier 251 having the predetermined thickness T11 may serve to primarily prevent the above-described spreading, and the second stopper 252 having the lyophobic characteristic with respect to the alignment solution may serve to secondarily prevent the spreading. The details of the second dam 250 will be described below.

The second alignment layer 260 may be arranged to cover the display region DA of the second substrate 210, and, for example, to cover the second electrode CE and the column spacer 240. At least a part of the second alignment layer 260 may extend up to the non-display region NDA of the second substrate 210 to come into contact with the surface of the second stopper 252 of the second dam 250. In this case, a portion 260T of the second alignment layer 260 may overlap a portion of a concave groove g2 (in FIG. 3) of the second stopper 252. Such a structure may be obtained in accordance with the limiting of flowing of the alignment solution to the non-display region NDA by the second stopper 252, which has the lyophobic characteristic with respect to the alignment solution that is discharged onto the second electrode CE and in accordance with increasing a resistive force against the flowing of the alignment solution to the non-display region NDA using the groove g2 (in FIG. 3), in the case where the second alignment layer 260 is formed using a printing method, such as an inkjet printing method. In some implementations, in order to obtain good wettability of the alignment solution with respect to the second electrode CE when the second alignment layer 260 is formed, the surface of the second substrate 210, on which the second electrode CE is formed, may have been treated such that the whole surface of the second substrate 210 has the lyophilic characteristic.

The second alignment layer 260 as described above may serve to initially align liquid crystal molecules LC of the liquid crystal layer LCL. The second alignment layer may include an alignment material. The alignment material of the second alignment layer 260 may be an organic polymer material. The organic polymer material may include, for example, at least one of a polyimide, a polyamic acid, and a polysiloxane.

A sealing member 300 may be interposed between the edge region of the non-display region NDA of the first display panel 100 and the edge region of the non-display region NDA of the second display panel 200 having the above-described configuration. The sealing member 300 may extend to surround the display region DA of the first display panel 100 and the display region DA of the second display panel 200, and may form a closed curve.

As described above, the sealing member 300 may couple the first display panel 100 and the second display panel 200 to each other. The sealing member 300 may adhere to the third insulating layer 150 and the second electrode CE. The sealing member 300 may include, for example, an adhesive such as a sealant, as an example.

The liquid crystal layer LCL may be interposed between the display region DA of the first display panel 100 and the display region DA of the second display panel 200, for example, between the first alignment layer 170 and the second alignment layer 260. The liquid crystal layer LCL may be include the liquid crystal molecules LC having positive or negative dielectric anisotropy.

Hereinafter, the detailed configuration of the dams 160 and 250 and the arrangement relationship between the dams 160 and 250 and the alignment layers 170 and 260 will be described in more detail.

Figure 3:
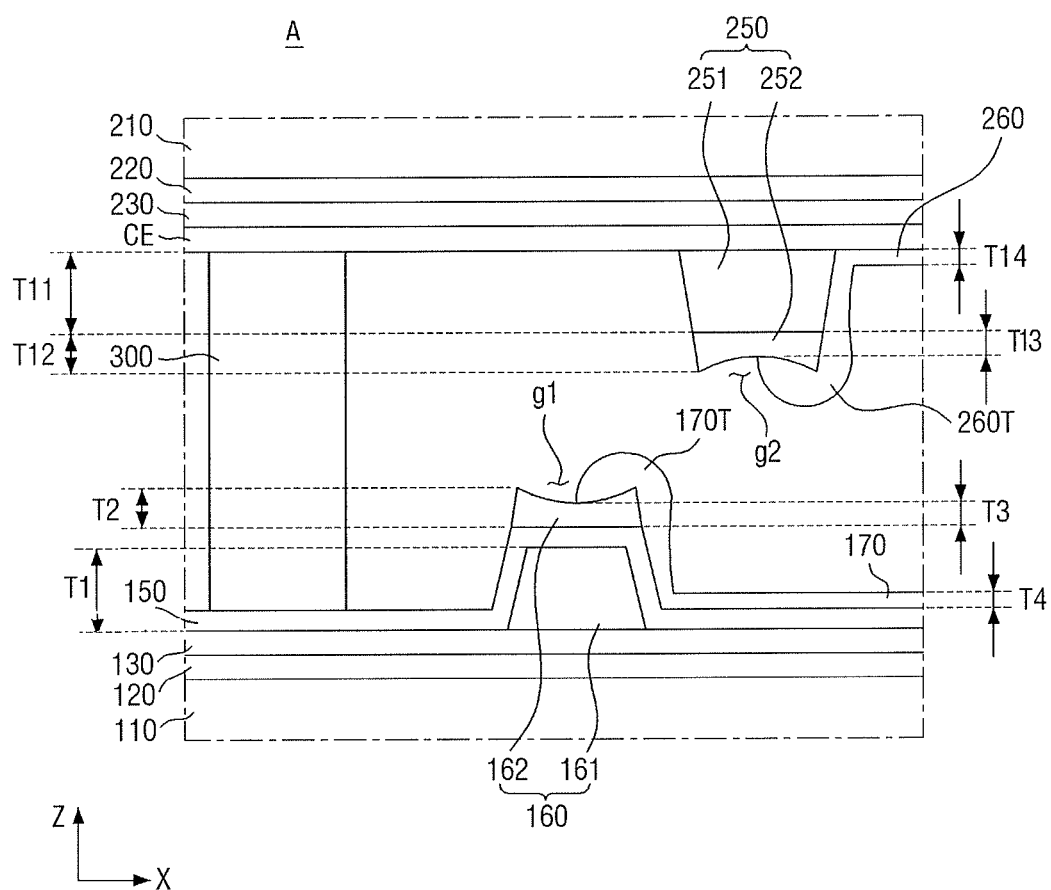
FIG. 3 illustrates an enlarged cross-sectional view of portion "A" of FIG. 2.
Figure 4:
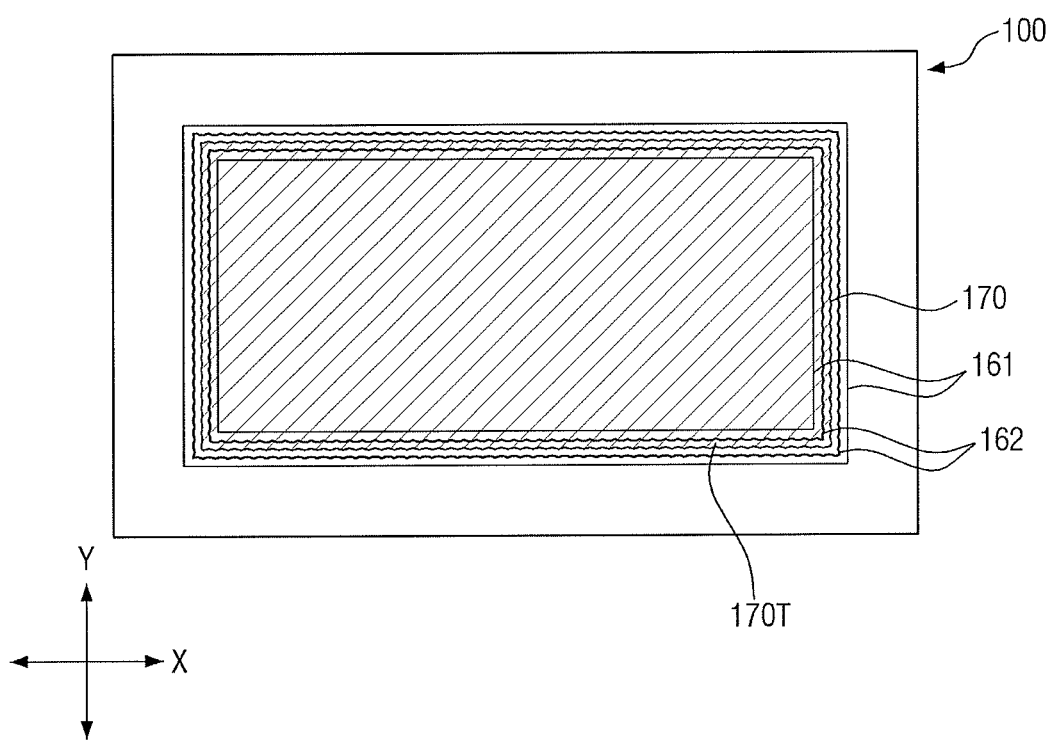
FIG. 4 illustrates a top view showing an arrangement relationship between a first dam and a first alignment layer of FIG. 2.

FIG. 3 illustrates an enlarged cross-sectional view of portion "A" of FIG. 2, and FIG. 4 illustrates a top view showing an arrangement relationship between a first dam and a first alignment layer of FIG. 2. FIG. 4 exemplifies only the first display panel 100 that includes the first alignment layer 170, and the first dam 160 and the first alignment layer 170 are exaggeratedly illustrated.

Referring to FIGS. 3 and 4, the first barrier 161 of the first dam 160 may extend to surround the display region DA of the first substrate 110. The first barrier 161 may form a closed curve. The first barrier 161 may have a predetermined thickness T1, for example, a thickness of about 3 μm or more. When forming the first alignment layer 170 on the first electrode PE using a printing method, such as an inkjet printing method, the thickness T1 of the first barrier 161 may be set to a thickness sufficient to primarily prevent the alignment solution including an alignment material that is discharged onto the first electrode PE from spreading toward the non-display region NDA. For example, the alignment solution discharged onto the first electrode PE may have a tendency to spread due to spread properties of the alignment solution, and such spreading may be blocked by the first dam 160. The first barrier 161 may be formed together with the color filter 140 in a patterning process. In this case, it may be possible to form the first barrier 161 with the predetermined thickness T1 through the patterning process. When the first barrier 161 is formed through the patterning process, the first barrier 161 may be formed as a continuous straight line along each extension direction surrounding the display region, as illustrated in FIG. 4.

The first barrier 161 may be formed of the same material as the color filter 140 arranged on the first substrate 110. For example, the first barrier 161 may include the same material as a blue filter of the color filter 140, or may include the same material as a red filter or a green filter. If the light blocking layer or the column spacer is formed on the first substrate 110, the first barrier 161 may be formed of the same material as the light blocking layer or the column spacer.

The first stopper 162 of the first dam 160 may extend to surround the display region DA of the first substrate 110 and may form a closed curve. The first stopper 162 may include a concave groove g1 that is formed on the surface along the extension direction. For example, the first stopper 162 may have a large thickness at edge portions thereof in comparison to the center portion thereof in a direction that is perpendicular to the extension direction. The first stopper 162 having the above-described shape may be formed by a coffee ring effect during drying of the alignment solution after the alignment solution, which may include an alignment material and may have a first viscosity, for example, a viscosity that exceeds about 70 cP, is spread on the first barrier 161 using a dispensing process and then is dried. In some implementations, the first alignment layer 170 may be formed by discharging the alignment solution, which includes an alignment material and has second viscosity, for example, viscosity in the range of about 6 cp to 70 cp, on the first electrode PE (in FIG. 2) using a printing process and then drying the discharged alignment solution.

The minimum thickness T3 of the first stopper 162 may be equal to or greater than the thickness T4 of the first alignment layer 170 that is arranged on the first electrode PE in the display region DA. The first stopper 162 may be formed from an alignment solution having a higher viscosity than the alignment solution of the first alignment layer 170. When the first stopper 162 is formed through the dispensing process, the first stopper 162 may be uneven along the extension direction, as illustrated in FIG. 4.

When the first stopper 162 is formed through the dispensing process, the first stopper 162 may have a thickness that is less than the thickness of the first barrier 161 that is formed using the patterning process. For example, the maximum thickness T2 of the first stopper 162 may be less than the thickness T1 of the first barrier 161.

The first stopper 162 having the above-described structure may have a thin thickness. When the first alignment layer 170 is formed using the printing method, such as the inkjet printing method, the groove g1 may heighten the resistive force against the flowing of the alignment solution that is discharged on the first electrode PE (in FIG. 2) toward the non-display region NDA.

Further, in order to heighten the control effect to prevent the alignment solution that is discharged on the first electrode PE (in FIG. 2) from spreading toward the non-display region NDA, the first stopper 162 may include an alignment material having a lyophobic characteristic with respect to the alignment solution. The alignment material of the first stopper 162 may be different from the alignment material of the first alignment layer 170. In this case, the lyophobic characteristic of the first stopper 162 may become greater with respect to the alignment solution that is used when the first alignment layer 170 is formed. For example, the first stopper 162 may be formed to include a polyimide that is a constituent material of the first stopper 162 or a material having other components.

When the first stopper 162 has a lyophobic characteristic with respect to the alignment solution that is used to form the first alignment layer 170, the alignment solution may have a convex shape at one portion of the first stopper 162, and a part 170T of the first alignment layer 170 that overlaps or comes into contact with the surface of the first stopper 162 may be formed with a thickness that is greater than the thickness of a portion that overlaps the first electrode PE (in FIG. 2) in the display region DA (in FIG. 2) of the first substrate 110.

The first dam 160, which includes the first barrier 161 and the first stopper 162, may be in the form of a single line along the extension direction. In other implementations, the first dam 160 may also be in the form of a multiline.

The second barrier 251 of the second dam 250 may extend to surround the display region DA of the second substrate 210. The second barrier 251 may form a closed curve. The second barrier 251 may have a predetermined thickness T11, for example, a thickness of about 3 μm or more. When forming the second alignment layer 260 on the second electrode CE using a printing method, such as an inkjet printing method, the thickness T11 of the second barrier 251 may be set to a thickness sufficient to primarily prevent the alignment solution including an alignment material that is discharged onto the second electrode CE from spreading toward the non-display region NDA. For example, the alignment solution discharged onto the second electrode CE may have a tendency to spread due to spread properties of the alignment solution, and such spreading may be blocked by the second dam 250. The second barrier 251 may be formed together with the column spacer 240 in a patterning process. In this case, it may be possible to form the second barrier 251 with the predetermined thickness T11 through the patterning process. When the second barrier 251 is formed through the patterning process, the second barrier may be formed as a continuous straight line along each extension direction surrounding the display region.

The second barrier 251 may include the same material as the column spacer 240 that is arranged on the second substrate 210. When the light blocking layer or the color filter is formed on the second substrate 210, the second barrier 251 may be formed of the same material as the light blocking layer or the color filter.

The second stopper 252 of the second dam 250 may extend to surround the display region DA of the second substrate 210 on the second barrier 251. The second stopper 252 may form a closed curve. The second stopper 252 may include a concave groove g2 that is formed on the surface thereof along the extension direction. For example, the second stopper 252 may have a large thickness at edge portions thereof in comparison to the center portion thereof in a direction that is perpendicular to the extension direction. The second stopper 252 having the above-described shape may be formed t by a coffee ring effect during drying of the alignment solution after the alignment solution, which may include an alignment material and may have a first viscosity, for example, a viscosity that exceeds about 70 cP, is spread on the second barrier 251 using a dispensing method and then is dried. In some implementations, the second alignment layer 260 may be formed by discharging the alignment solution, which includes an alignment material and has second viscosity, for example, viscosity in the range of about 6 cp to 70 cp, on the second electrode CE (in FIG. 2) using a printing process and then drying the discharged alignment solution.

The minimum thickness T13 of the second stopper 252 may be equal to or greater than the thickness T14 of the second alignment layer 260 that is arranged on the second electrode CE in the display region DA. The second stopper 252 may be formed from an alignment solution having a higher viscosity than the alignment solution of the second alignment layer 260. When the second stopper 252 is formed through the dispensing process, the first stopper 252 may be uneven along the extension direction like the first stopper 162 as illustrated in FIG. 4.

When the second stopper 252 is formed through the dispensing process, the first stopper 252 may have a thickness that is less than the thickness of the second barrier 251 that is formed using the patterning process. For example, the maximum thickness T12 of the second stopper 252 may be less than the thickness T11 of the second barrier 251.

The second stopper 252 having the above-described structure may have a thin thickness. When the second alignment layer 260 is formed using the printing method, such as the inkjet printing method, the groove g2 may heighten the resistive force against the flowing of the alignment solution that is discharged on the second electrode CE (in FIG. 2) toward the non-display region NDA.

Further, in order to heighten the control effect to prevent the alignment solution that is discharged on the second electrode CE (in FIG. 2) from spreading toward the non-display region NDA, the second stopper 252 may include an alignment material having a lyophobic characteristic with respect to the alignment solution. The alignment material of the second stopper 252 may be different from the alignment material of the second alignment layer 260. In this case, the lyophobic characteristic of the second stopper 252 may become greater with respect to the alignment solution that is used when the second alignment layer 260 is formed. For example, the second stopper 252 may be formed to include a polyimide that is a constituent material of the second stopper 252 or a material having other components.

When the second stopper 252 has a lyophobic characteristic with respect to the alignment solution that is used to form the second alignment layer 260, the alignment solution may have a convex shape at one portion of the second stopper 252, and a part 260T of the second alignment layer 260 that overlaps or comes into contact with the surface of the second stopper 252, may be formed with a thickness that is greater than the thickness of a portion that overlaps the second electrode CE (in FIG. 2) in the display region DA (in FIG. 2) of the second substrate 210.

The second dam 250, which includes the second barrier 251 and the second stopper 252, may be arranged in the form of a single line shape along the extension direction or in the form of a multiline.

As described above, the display device 10 according to an embodiment may be provided with the first dam 160 that includes the first barrier 161 having the predetermined thickness T1 and the first stopper having the lyophobic characteristic with respect to the alignment solution that is used to form the first alignment layer 170. Accordingly, the thickness of the dam may be minimized, and the spreading of the alignment solution that is used to form the first alignment layer 170 onto the non-display region NDA of the first substrate 110 may be reduced.

Accordingly, the increase of the width of the non-display region NDA in the display device 10 can be reduced, and thus a slim bezel can be provided.

Figure 5:
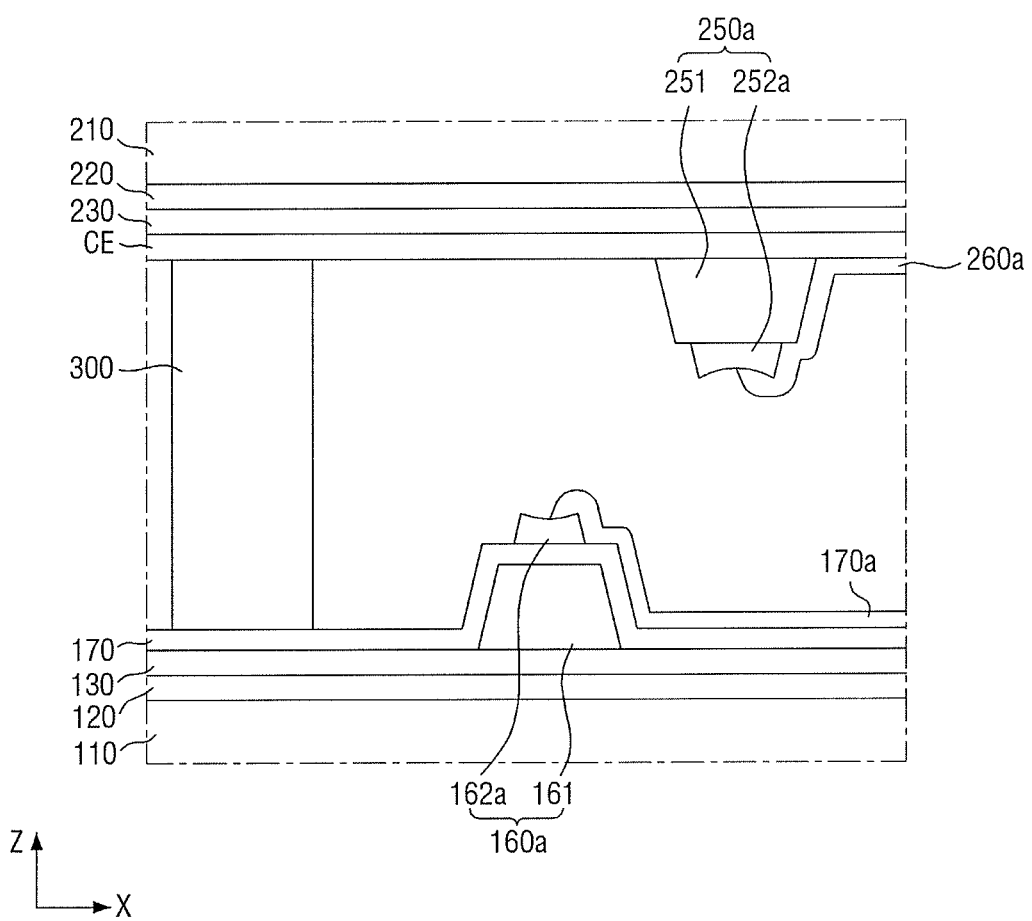
FIGS. 5 to 7 illustrate cross-sectional views showing various embodiments of a first dam and a second dam.
Figure 6:
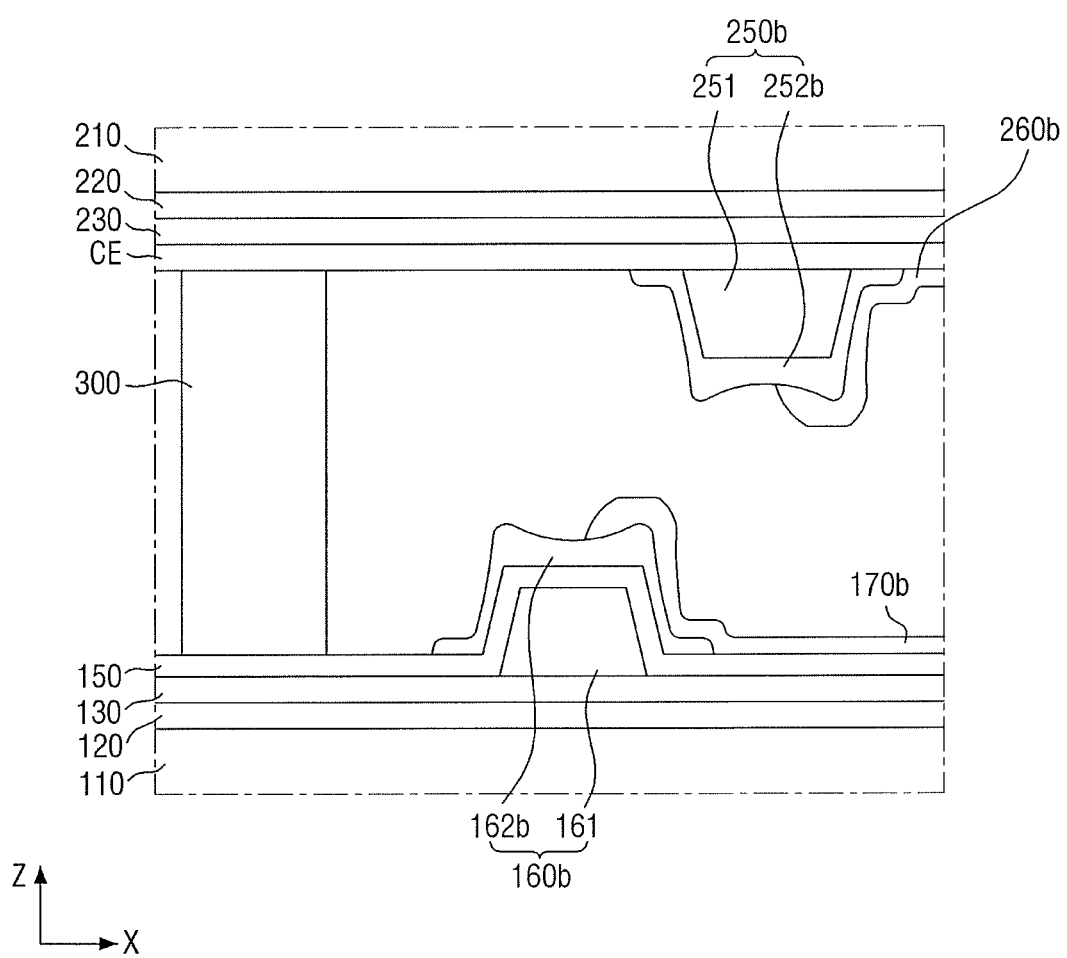
Figure 7:
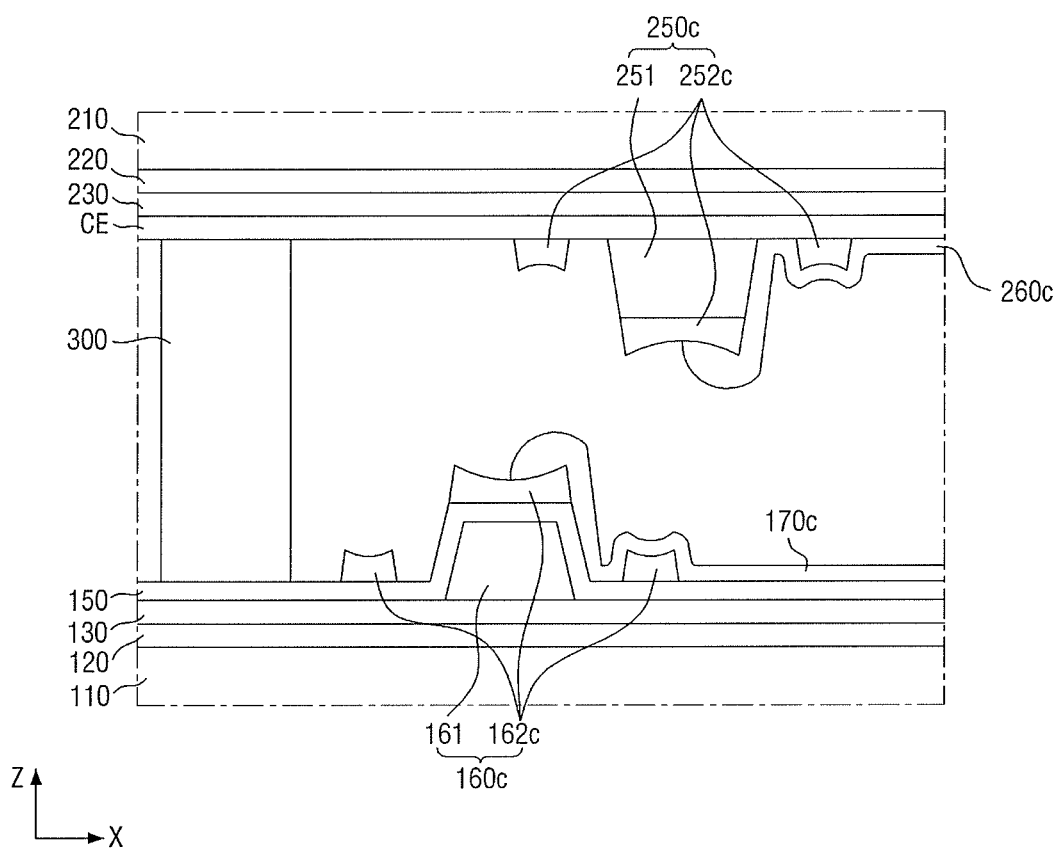

FIGS. 5 to 7 are cross-sectional views showing various embodiments of a first dam and a second dam.

FIG. 5 exemplifies that a first dam 160a includes a first barrier 161 and a first stopper 162a having a width that is smaller than the width of the first barrier 161. The width of the first stopper 162a may be controlled through adjustment of the amount of an alignment solution that is used to form the first stopper 162a.

The first dam 160a may heighten the resistive force against flowing of the alignment solution of the first alignment layer 170a to the non-display region NDA through forming of a step portion on a side portion of the first barrier 161 and a side portion of the first stopper 162a. Accordingly, the flowing of the alignment solution of the first alignment layer 170a to the non-display region may be reduced more effectively.

A second dam 250a may include a second barrier 251 and a second stopper 252a arranged on the second barrier 251 and having a width that is smaller than the width of the second barrier 251. The second dam 250a may play the same role as the first dam 160a with respect to the second alignment layer 260a.

FIG. 6 exemplifies that a first dam 160b includes a first barrier 161 and a first stopper 162b that is arranged on at least a part of a side surface and an upper surface of the first barrier 161. The first stopper 162b may be formed when a large amount of alignment solution that is used to form the first stopper 162b is spread on the upper surface of the first barrier 161 such that the alignment solution flows to the side surface of the first barrier 161. A portion that is formed on the upper surface of the first stopper 162b and a portion that is formed on the side surface of the first stopper 162b may be formed as a continuous shape.

When the first dam 160b has a wide region through the first stopper 162b and has the lyophobic characteristic with respect to the alignment solution of the first alignment layer 170b, the control effect to prevent the alignment solution of the first alignment layer 170b from spreading toward the non-display region NDA may be heightened. Accordingly, the flowing of the alignment solution of the first alignment layer 170b to the non-display region NDA may be reduced more effectively.

The second dam 250b may include a second barrier 251 and a second stopper 252b arranged on at least a part of a side surface and an upper surface of the second barrier 251. A portion that is formed on the upper surface of the second stopper 252b and a portion that is formed on the side surface of the second stopper 252b may be formed as a continuous shape. The second dam 250b may play the same role as the first dam 160b with respect to the second alignment layer 260b.

FIG. 7 exemplifies that a first dam 160c may include a first barrier 161 and a first stopper 162c that is arranged on at least a part of a side surface and an upper surface of the first barrier 161. A portion that is formed on the upper surface of the first stopper 162c and a portion that is formed on the side surface of the first stopper 162c may be separated or spaced apart. In some implementations, the portions of the first stopper 162c may be formed on the third insulating layer 150 before and after the first barrier 161 in a flowing direction of the alignment solution.

The first dam 160c may have an accommodation groove formed thereon to hold therein the alignment solution of the first alignment layer 170b when the alignment solution of the first alignment layer 170b moves toward the non-display region NDA through the first stopper 162c. Accordingly, the flowing of the alignment solution of the first alignment layer 170c to the non-display region NDA can be reduced more effectively.

The second dam 250c may include a second barrier 251 and a second stopper 252c arranged on at least a part of a side surface and an upper surface of the second barrier 251. A portion that is formed on the upper surface of the second stopper 252c and a portion that is formed on the side surface of the second stopper 252c may be separated or spaced apart. In some implementations, the portions of the first stopper 162c may be formed on the third insulating layer 150 before and after the first barrier 161 in a flowing direction of the alignment solution 260c. The second dam 250c may play the same role as the first dam 160c with respect to the second alignment layer 260c.

Next, a method for fabricating a display device 10 according to an embodiment will be described.

FIGS. 8 to 18 illustrate cross-sectional views explaining stages of a method for fabricating a display device of FIG. 1.

Figure 8:
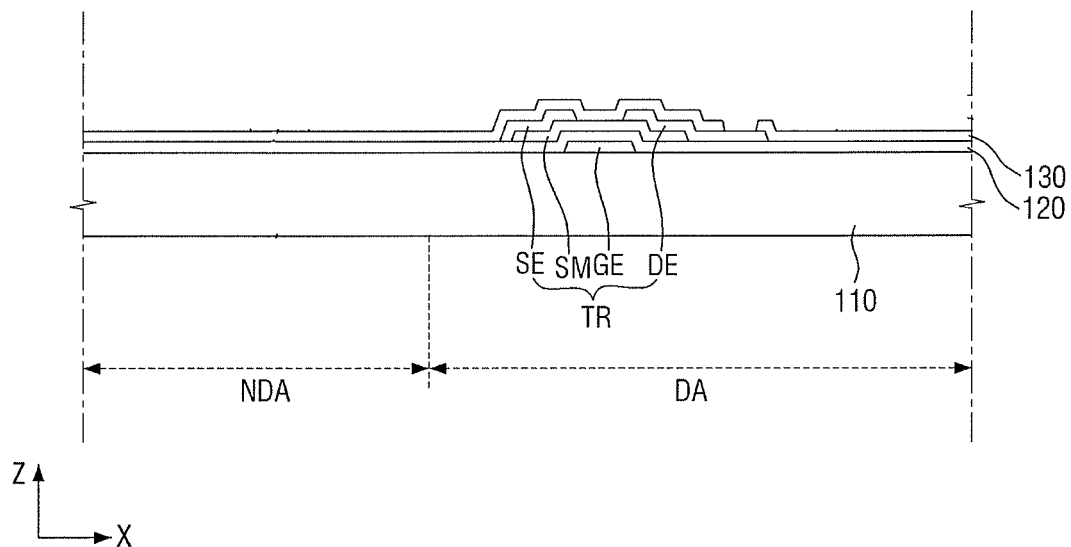
FIGS. 8 to 18 illustrate cross-sectional views explaining stages of a method for fabricating a display device of FIG. 1.

Referring to FIG. 8, a first substrate 110 that includes a display region DA and a non-display region NDA that is arranged on an outside of the display region DA to surround the display region DA may be prepared. On the first substrate 110, a thin film transistor TR, a first insulating layer 120, and a second insulating layer 130 may be formed along a third direction Z. Such configuration is described above in detail with regard to FIG. 2.

Figure 9:
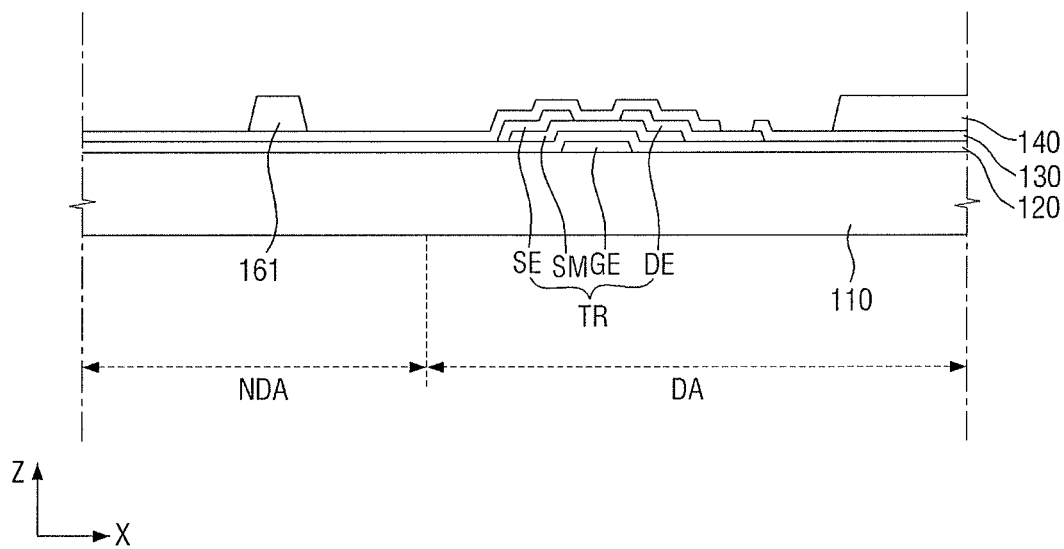
Figure 10:
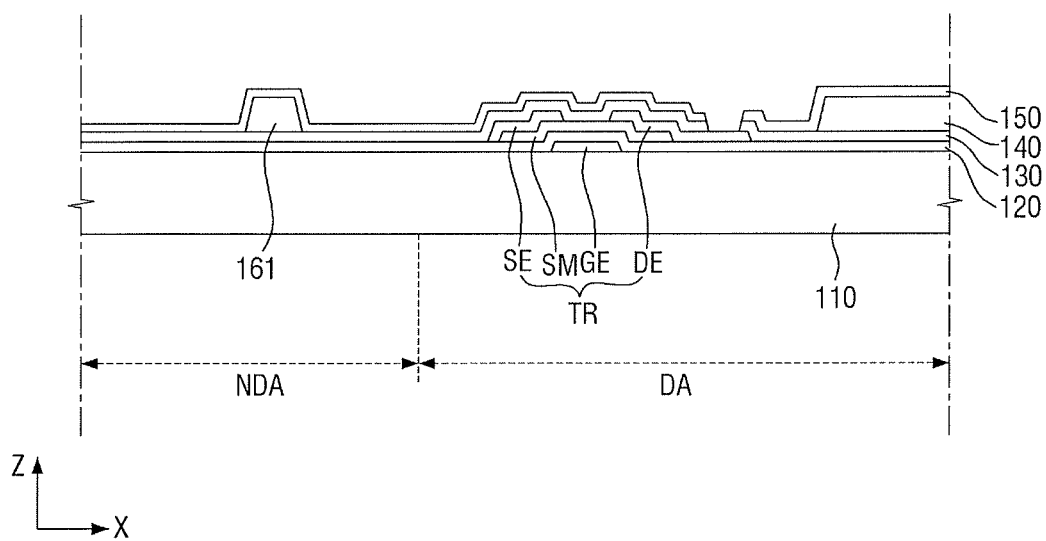
Figure 11:
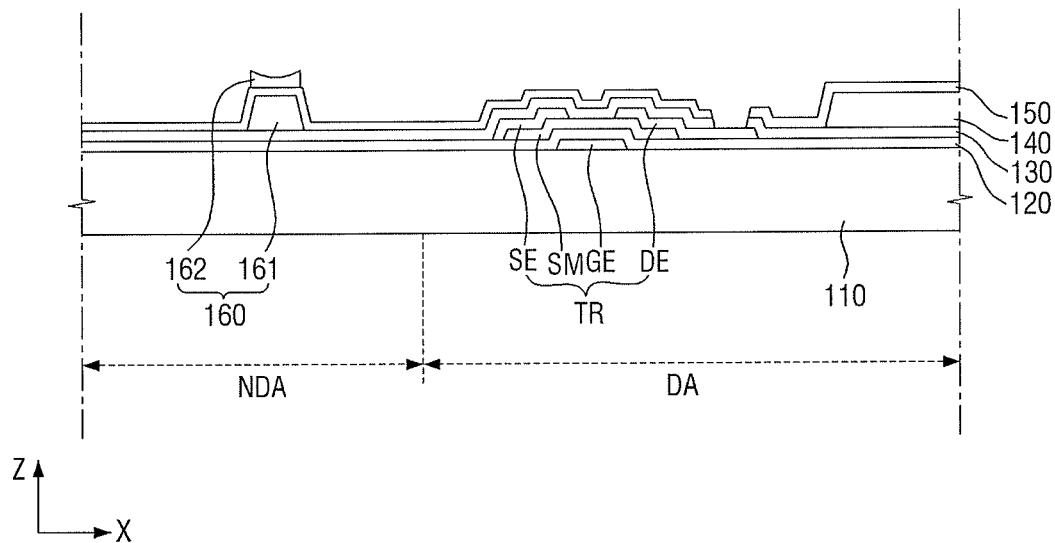

Referring to FIGS. 9 to 11, a first dam 160, which includes a first barrier 161 and a first stopper 162 that are stacked in a region of the non-display region NDA that is adjacent to the display region DA in a third direction Z, may be formed on the first substrate 110.

For example, referring to FIG. 9, the first barrier 161 may be formed on the second insulating layer 130 in the region of the non-display region NDA that is adjacent to the display region DA. The first barrier 161 may extend to surround the display region DA on the second insulating layer 130, and may form a closed curve. The first barrier 160 may be formed on the second insulating layer 130 together with a color filter 140 by a patterning method when the color filter 140 is formed in the display region DA.

Referring to FIG. 10, a third insulating layer 150 may be formed in the display region DA and the non-display region NDA on the second insulating layer 130 to cover the color filter 140 and the first barrier 161.

Referring to FIG. 11, a first stopper 162 may be formed on the third insulating layer 150 to overlap the first barrier 161. The first stopper 162 may be formed by spreading an alignment solution, which includes an alignment material and has a first viscosity, for example, a viscosity that exceeds about 70 cP, on the first barrier 161 using a dispensing process. A concave groove may be formed on the surface of the first stopper 162. The first stopper 161 may form a first dam 160 together with the first barrier 161.

Figure 12:
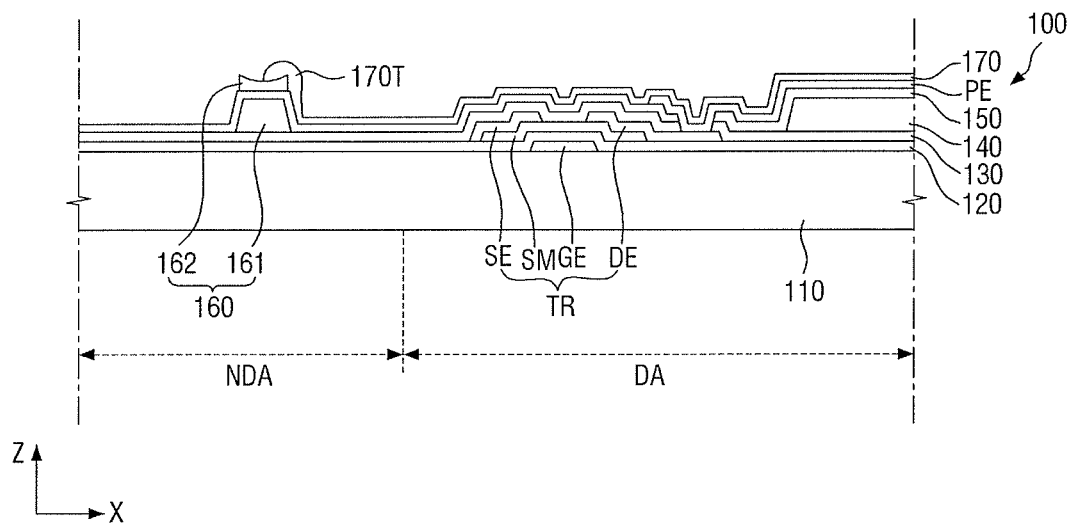

Referring to FIG. 12, a first alignment layer 170 may be formed in the display region DA of the first substrate 110, and, for example, on a first electrode PE and the third insulating layer 150. The first alignment layer 170 may be formed by discharging an alignment solution that includes an alignment material that is different from the alignment material of the first stopper 162 and that has a second viscosity that is lower than the first viscosity onto the first electrode PE and the third insulating layer 150 using a printing method, such as an inkjet printing method, and then drying the discharged alignment solution The viscosity of the alignment solution used to form the first alignment layer 170 may be in the range of, for example, about 6 cp to 70 cp.

Figure 13:
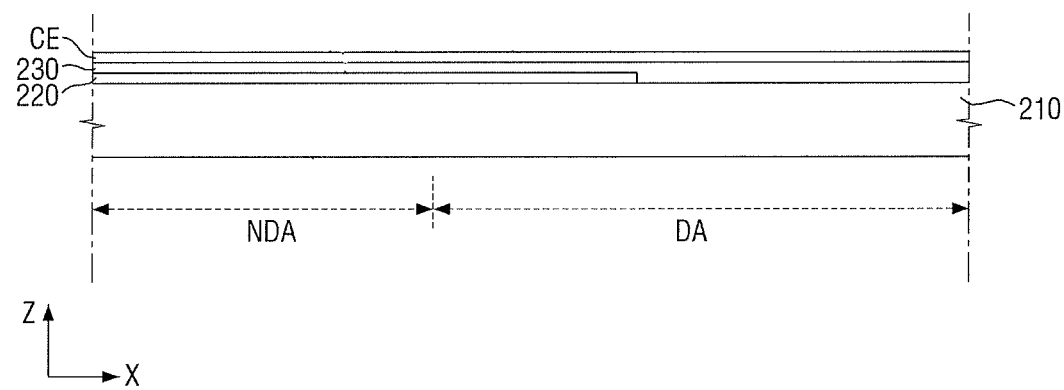

Referring to FIG. 13, a second substrate 210 that includes a display region DA and a non-display region NDA that are positioned on an outside of the display region DA to surround the display region DA may be prepared. On the second substrate 210, a light blocking layer 220, an overcoat layer 230, and a second electrode CE, which are stacked in a third direction Z, may be formed. Such configuration described in detail above with regard to FIG. 2.

Figure 14:
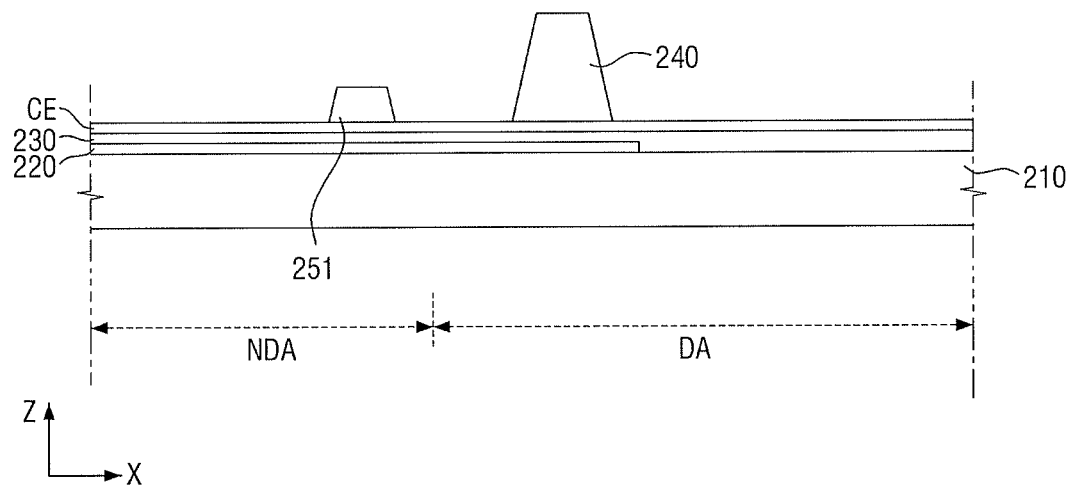
Figure 15:
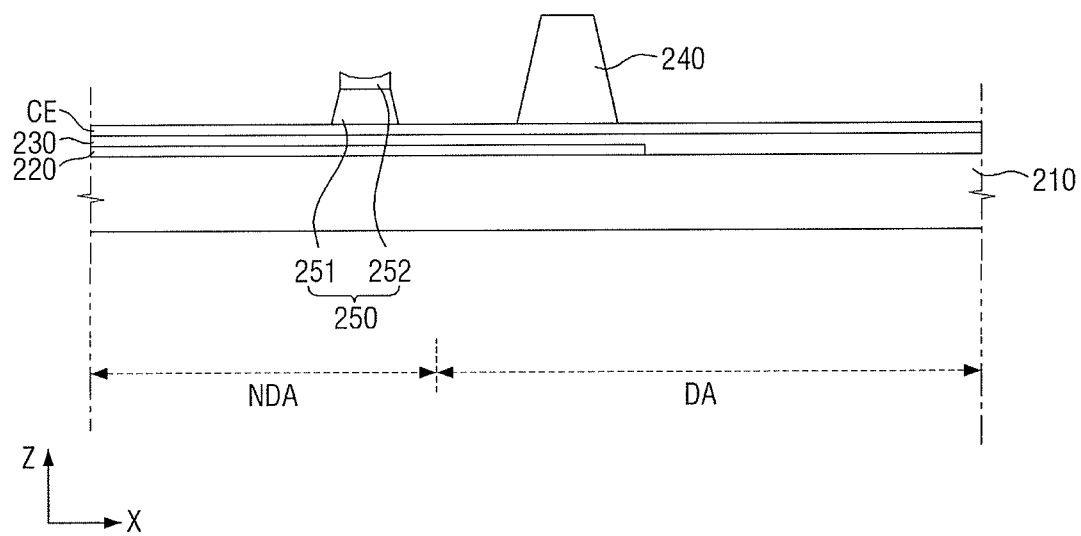

Referring to FIGS. 14 and 15, a second dam 250, which includes a second barrier 251 and a second stopper 252 that are stacked on a region of the non-display region NDA that is adjacent to the display region DA in the third direction Z, may be formed on the second substrate 210.

For example, referring to FIG. 14, the second barrier 251 may be formed in the region of the non-display region NDA that is adjacent to the display region DA on the second electrode CE. The second barrier 252 may extend to surround the display region DA on the second electrode CE, and may form a closed curve. The second barrier 250 may be formed in a patterning process at the same time that the column spacer 240 is formed in the display region DA on the second electrode CE.

Referring to FIG. 15, a second stopper 252 may be formed on the second electrode CE to overlap the second barrier 251. The second stopper 252 may be formed by spreading an alignment solution that includes an alignment material and that has a first viscosity, for example, a viscosity that exceeds about 70 cP, on the second barrier 251 using a dispensing process. A concave groove may be formed on the surface of the second stopper 252. The second stopper 252 may form a second dam 250 together with the second barrier 251.

Figure 16:
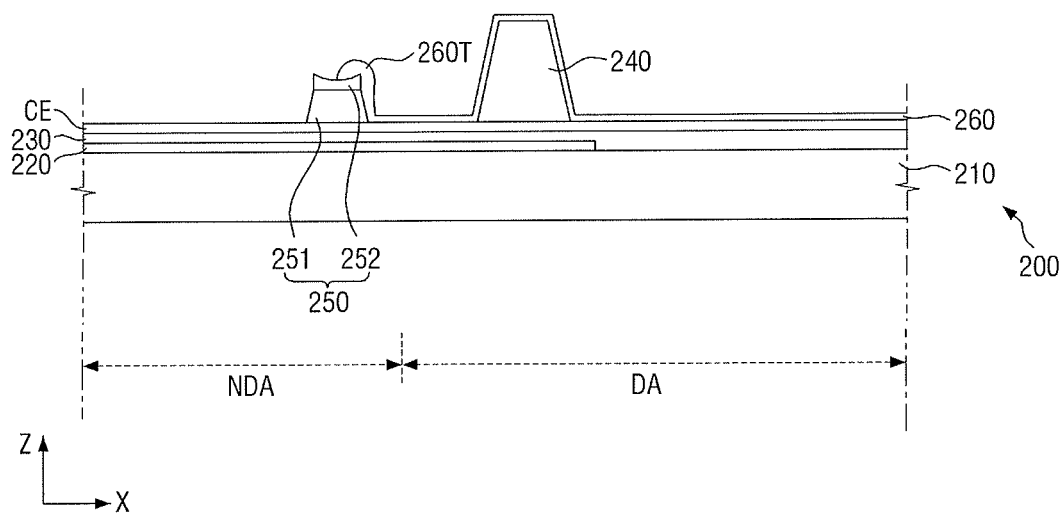

Referring to FIG. 16, a second alignment layer 260 may be formed in the display region DA of the second substrate 210, for example, on the second electrode CE and the column spacer 240. The second alignment layer 260 may be formed by discharging the alignment solution, which includes an alignment material that is different from the alignment material of the second stopper 252 and has a second viscosity that is lower than the first viscosity onto the second electrode CE and the column spacer 240 using a printing method, such as an inkjet printing method, and then drying the discharged alignment solution. For example, the viscosity of the alignment solution used to form the second alignment layer may be in the range of about 6 cp to 70 cp.

Figure 17:
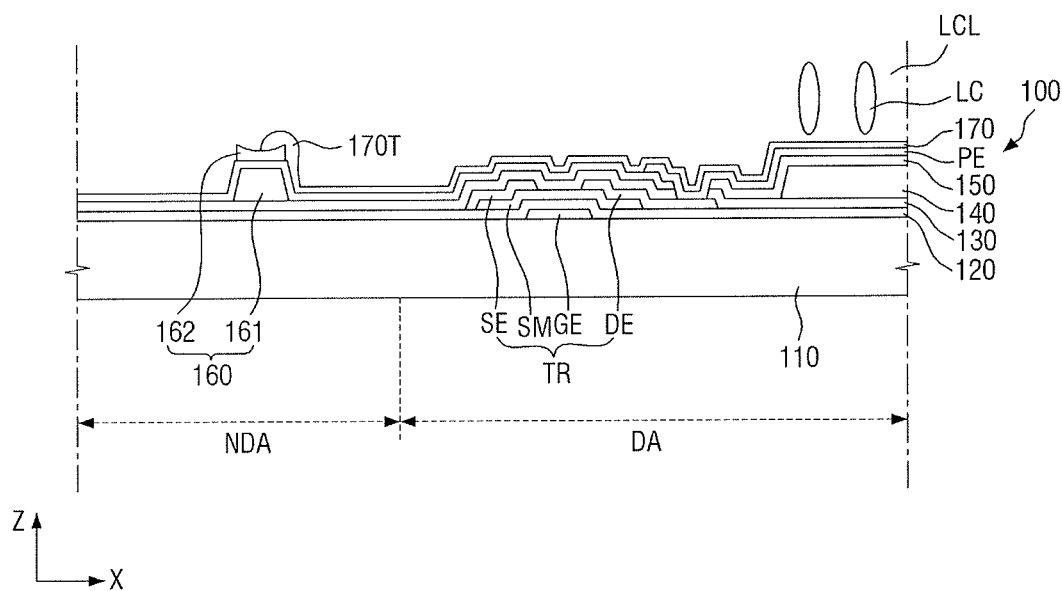

Referring to FIG. 17, a liquid crystal layer LCL may be formed by providing of liquid crystal molecules LC onto the first electrode PE. In implementations, the liquid crystal layer LCL may be formed by providing of the liquid crystal molecules LC onto the second electrode 210.

Figure 18:
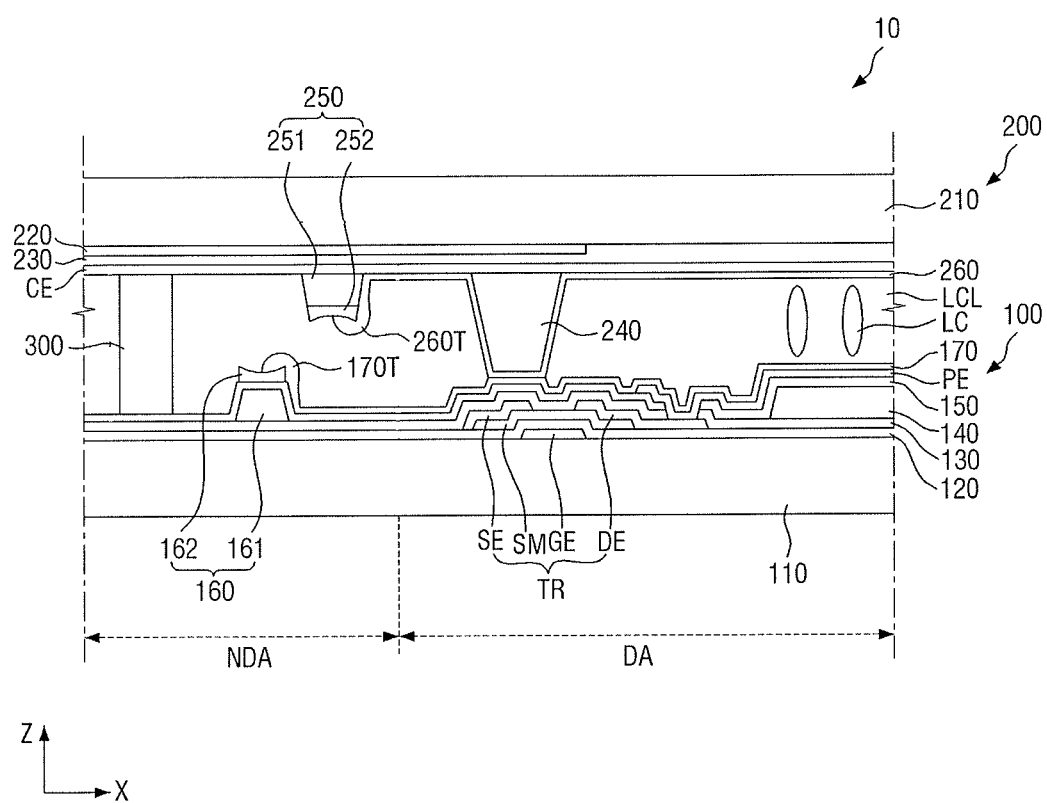

Referring to FIG. 18, a display device 10 may be formed by coupling a first display panel 100 and a second display panel 200 in a state where a sealing member 300 is interposed between the first display panel 100 and the second display panel 200. The liquid crystal layer LCL may be interposed between the first alignment layer 170 and the second alignment layer 260.

By way of summation and review, In a typical liquid crystal display, two substrates, between which a liquid crystal layer is interposed, are bonded together by a sealing member. On each surface of the two substrates, an alignment layer for determining an initial alignment direction is arranged.

Generally, the alignment layer is formed by discharging an alignment solution that includes an alignment material (alignment solid content) on the surfaces of the two substrates using an inkjet printing method and drying the discharged alignment solution. However, while the alignment solution is discharged using the inkjet printing method, the alignment solution may spread toward an outside of the two substrates, that is, toward a non-display region, due to spread properties of the alignment solution. In this case, a gap between the sealing member that is arranged in the non-display region of the two substrates and a display region on which a pixel electrode is arranged may become large, which may cause a width of the non-display region of the liquid crystal display also to become large. As a result, it may be difficult to implement a slim bezel that covers the non-display region of the two substrates. Accordingly, a dam between the sealing member and the display region in which the pixel electrode is arranged is desirable to reduce spreading of the alignment solution.

Generally, a dam may be formed through a patterning process at the same time that a color filter, a column spacer, or a black matrix of the liquid crystal display is formed. The dam may be composed of a single layer having a predetermined thickness. However, although it is desirable to increase the thickness of the dam in order to reduce the spreading of the alignment solution, there is a limit to how much the thickness of the dam may be increased within a predetermined cell gap of the liquid crystal display.

Embodiments provide a display device that can provide a slim bezel through minimization of a thickness of a dam and reduction of spreading of an alignment solution.

Embodiments further provide a method for fabricating a display device that can provide a slim bezel through minimization of a thickness of a dam and reduction of spreading of an alignment solution.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A display device, comprising:
   a substrate including a display region and a non-display region, the non-display region being positioned on an outside of the display region;
   a second layer disposed in the non-display region of the substrate;
   a third layer between the substrate and the second layer, and
   a fourth layer covering the display region of the substrate, at least a part of the fourth layer extending to the non-display region and contacting a surface of the second layer, wherein
   the second layer covers side surfaces of the third layer and an upper surface of the third layer,
   a thickness of the second layer is less than a thickness of the third layer, and
   a thickness of the second layer disposed on the upper surface of the third layer is greater than a thickness of the second layer disposed on the side surfaces of the third layer.

2. The display device as claimed in claim 1, wherein the second layer disposed on the upper surface of the third layer has an indentation pattern indented toward the upper surface of the third layer.

3. The display device as claimed in claim 2, wherein:
   a minimum thickness of the second layer is equal to or greater than a minimum thickness of a portion of the fourth layer that is in the display region of the substrate, and
   a portion of the fourth layer that contacts the surface of the second layer has a maximum thickness that is greater than a maximum thickness of a portion of the layer that is in the display region of the substrate.

4. The display device as claimed in claim 1, further comprising a color filter in the display region of the substrate.

5. The display device as claimed in claim 4, wherein:
   the third layer includes a same material as the color filter,
   each of the second layer and the fourth layer includes an organic polymer, and
   the organic polymer of the second layer is different from the organic polymer of the fourth layer.

6. The display device as claimed in claim 5, wherein the second layer has a lyophobic characteristic with respect to the fourth layer.

7. The display device as claimed in claim 1, wherein at least a part of the fourth layer is disposed on an upper surface of the surface of the second layer.

8. The display device as claimed in claim 1, further comprising a liquid crystal layer directly on the second layer in the display region.

9. A display device, comprising:
   a substrate including a display region and a non-display region, the non-display region being positioned on an outside of the display region;
   a second layer disposed in the non-display region of the substrate;
   a third layer between the substrate and the second layer, and
   a fourth layer covering the display region of the substrate, at least a part of the fourth layer extending to the non-display region and contacting a surface of the second layer, wherein
   the second layer covers side surfaces of the third layer and an upper surface of the third layer with the second layer disposed on the upper surface of the third layer having an indentation pattern indented toward the upper surface of the third layer, and
   a maximum thickness of the second layer is less than a thickness of the third layer.

10. The display device as claimed in claim 9, wherein the maximum thickness of the second layer disposed on the upper surface of the third layer is greater than the maximum thickness of the second layer disposed on the side surfaces of the third layer.

11. The display device as claimed in claim 9, wherein:
    a minimum thickness of the second layer is equal to or greater than a thickness of a portion of the fourth layer that is in the display region of the substrate, and
    a portion of the fourth layer that contacts the surface of the second layer has a thickness that is greater than a thickness of a portion of the layer that is in the display region of the substrate.

12. The display device as claimed in claim 9, wherein at least a part of the fourth layer is disposed on an upper surface of the surface of the second layer.

13. A display device, comprising:
    a substrate including a display region and a non-display region, the non-display region being positioned on an outside of the display region;
    a color filter in the display region of the substrate;
    a second layer disposed in the non-display region of the substrate;
    a third layer between the substrate and the second layer, the third layer including a same material as the color filter; and
    a fourth layer covering the display region of the substrate, at least a part of the fourth layer extending to the non-display region and contacting a surface of the second layer, wherein
    the second layer covers side surfaces of the third layer and an upper surface of the third layer, and
    a maximum thickness of the second layer is less than a thickness of the third layer.

14. The display device as claimed in claim 13, wherein:
    each of the second layer and the fourth layer includes an organic polymer, and
    the organic polymer of the second layer is different from the organic polymer of the fourth layer.

15. The display device as claimed in claim 13, wherein the second layer has a lyophobic characteristic with respect to the fourth layer.

16. The display device as claimed in claim 13, wherein at least a part of the fourth layer is disposed on an upper surface of the surface of the second layer.

* * * * *